United States Patent
Hartjes

(10) Patent No.: US 9,599,910 B2
(45) Date of Patent: Mar. 21, 2017

(54) FACET MIRROR DEVICE

(71) Applicant: Carl Zeiss SMT GmbH, Oberkochen (DE)

(72) Inventor: Joachim Hartjes, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 375 days.

(21) Appl. No.: 13/744,943

(22) Filed: Jan. 18, 2013

(65) Prior Publication Data

US 2013/0120730 A1 May 16, 2013

Related U.S. Application Data

(63) Continuation of application No. PCT/EP2010/060955, filed on Jul. 28, 2010.

(51) Int. Cl.
| | |
|---|---|
| *G03F 7/20* | (2006.01) |
| *G02B 5/08* | (2006.01) |
| *G02B 5/09* | (2006.01) |
| *G02B 5/132* | (2006.01) |
| *G02B 7/18* | (2006.01) |
| *G02B 7/182* | (2006.01) |

(52) U.S. Cl.
CPC ............ *G03F 7/70825* (2013.01); *G02B 5/08* (2013.01); *G02B 5/0891* (2013.01); *G02B 5/09* (2013.01); *G02B 5/132* (2013.01); *G02B 7/182* (2013.01); *G02B 7/1815* (2013.01); *G03F 7/70075* (2013.01); *Y10T 29/49826* (2015.01)

(58) Field of Classification Search
CPC ......... G02B 5/08; G02B 5/0891; G02B 5/09; G02B 7/1815; G02B 7/182; G02B 5/132; G03F 7/70075; G03F 7/70825
USPC .............. 355/67, 66, 71; 359/838, 872, 850; 29/428
See application file for complete search history.

(56) References Cited

U.S. PATENT DOCUMENTS

| | | | | |
|---|---|---|---|---|
| 4,268,123 | A * | 5/1981 | Mesco ........................ | 248/488 |
| 2005/0030653 | A1 | 2/2005 | Holderer et al. | |
| 2006/0103908 | A1 | 5/2006 | Loopstra et al. | |
| 2006/0252355 | A1 * | 11/2006 | Kumasaka ..................... | 451/44 |
| 2008/0043321 | A1 * | 2/2008 | Bowering et al. ............ | 359/359 |
| 2010/0007866 | A1 * | 1/2010 | Warm et al. ................... | 355/66 |
| 2013/0100426 | A1 | 4/2013 | Warm et al. | |

FOREIGN PATENT DOCUMENTS

| | | |
|---|---|---|
| DE | 102 05 425 A1 | 5/2003 |
| DE | 103 24 796 | 12/2004 |

(Continued)

OTHER PUBLICATIONS

International Search Report and Written Opinion for corresponding PCT Appl No. PCT/EP2010/060955, dated Jan. 19, 2011.

(Continued)

*Primary Examiner* — Michelle M Iacoletti
(74) *Attorney, Agent, or Firm* — Fish & Richardson P.C.

(57) ABSTRACT

A facet mirror device includes a facet element and a support element which supports the facet element. The facet element includes a curved support section. The support element includes a support section. The support section of the support element forms a support edge which contacts the curved support section of the facet element.

36 Claims, 5 Drawing Sheets

(56) References Cited

FOREIGN PATENT DOCUMENTS

| EP | 0 598 950 | 6/1994 |
|----|-----------|--------|
| JP | S57-146107 | 9/1982 |
| JP | 2004-361624 | 12/2004 |
| JP | 2005-517291 | 6/2005 |
| JP | 2006-140504 | 6/2006 |
| JP | 2010-506135 | 2/2010 |
| JP | 2010-519725 | 6/2010 |
| WO | WO 2008/101656 | 8/2008 |

OTHER PUBLICATIONS

Japanese Office Action, with translation thereof, for JP Appl No. 2013-520975, dated Jun. 25, 2014.

\* cited by examiner

FACET MIRROR DEVICE

CROSS-REFERENCE TO RELATED APPLICATIONS

The present application is a continuation of, and claims benefit under 35 USC 120 to, international application PCT/EP2010/060955, filed Jul. 28, 2010, the contents of which are hereby incorporated by reference in its entirety.

FIELD

The disclosure relates to a facet mirror device that may be used within an optical device used in exposure processes, in particular in microlithography systems. It further relates to an optical imaging arrangement including such a facet mirror device. It further relates to a method of supporting a facet element of a facet mirror device and a method of manufacturing a facet mirror device. The disclosure may be used in the context of photolithography processes for fabricating microelectronic devices, in particular semiconductor devices, or in the context of fabricating devices, such as masks or reticles, used during such photolithography processes.

BACKGROUND

Typically, the optical systems used in the context of fabricating microelectronic devices such as semiconductor devices include a plurality of optical element modules including optical elements, such as lenses, mirrors, gratings etc., in the light path of the optical system. Those optical elements usually cooperate in an exposure process to illuminate a pattern formed on a mask, reticle or the like and to transfer an image of this pattern onto a substrate such as a wafer. The optical elements are usually combined in one or more functionally distinct optical element groups that may be held within distinct optical element units. Facet mirror devices as the ones mentioned above, among others may serve to homogenize the exposure light beam, i.e. to effect a power distribution within the exposure light beam which is as uniform as possible.

Due to the ongoing miniaturization of semiconductor devices there is not only a permanent desire for enhanced resolution but also a desire for enhanced accuracy of the optical systems used for fabricating those semiconductor devices. This accuracy obviously not only has to be present initially but has to be maintained over the entire operation of the optical system. A particular problem in this context is proper heat removal from the optical components to avoid uneven thermal expansion of these components leading to uneven deformation of these components and, ultimately, to undesired imaging errors.

As a consequence highly sophisticated facet mirror devices have been developed such as disclosed, for example, in DE 102 05 425 A1 (Holderer et al.) and DE 103 24 796 A1 (Roβ-Meβemer), the respective entire disclosure of which is incorporated herein by reference.

Both these documents, among others, show facet mirror devices where facet elements with a spherical rear surface sit in an associated recess within a support element. The spherical rear surface rests against a corresponding spherical wall of the support element confining this recess. While such a sphere to sphere interface theoretically may provide a large area of contact with good heat transfer from the facet element to the support element, this large area contact mainly depends on the manufacturing accuracy of both the facet element and the support element. In particular, the spherical recess can be rather expensive to manufacture at an accuracy of a few microns or less, as is desirable in many cases in all three directions in space.

To overcome this problem DE 103 24 796 A1 (Roβ-Meβemer) suggests to place a relatively soft coating (e.g. a gold coating) onto one of the spherical surfaces which compensates manufacturing tolerances by deformation. However, despite the low rigidity of this coating, due to the large contact area such deformation can involve relatively large forces which can introduce undesired deformation into the facet element.

Another approach is disclosed in DE 102 05 425 A1 (Holderer et al.) wherein the spherical rear surface of the facet element, more or less in a line contact, rests against a conical wall confining the recess receiving the facet element. This solution, due to the line contact can provide a lower heat transfer while still not considerably reducing the manufacturing effort for the conical wall to have the desired accuracy.

A third approach to support the facet elements is disclosed in DE 102 05 425 A1 (Holderer et al.) wherein the spherical rear surface of the facet element, more or less in a three point contact, rests against three small spheres each located at a free end of a support pin element. Here, the heat transfer can be even worse without considerably reducing the manufacturing effort for the three small spheres to have the desired accuracy.

In all three cases outlined above, a manipulating lever is connected to the rear surface of the facet element, and corresponding manipulators act on the manipulating lever to adjust the position and, predominantly, the orientation of the facet element with respect to the support element. Furthermore, in some cases, the manipulating lever is used for fixing the facet element relative to the support element once it has been adjusted. This solution can have the disadvantage that the manipulating lever adds to the complexity and, ultimately, to the cost not only of the facet element but also of other components such as the support element. Furthermore, multiple manipulators are used to generate mutually counteracting manipulation forces to allow accurate adjustment in a reasonable amount of time.

SUMMARY

In one aspect, the disclosure provides a simple way of supporting a facet element of a facet mirror device at a high accuracy, in particular an accuracy of a few microns or less.

In another aspect, the disclosure allows easy adjustment of the facet element to the desired position and orientation with respect to the support element.

The disclosure is based on the teaching that it is possible to provide a simple and reliable, easily adjustable support to the facet element if the facet element is supported on a (preferably curved) support edge formed at the support element such that a general line contact exists between the support edge and the facet element. Such a curved support edge may be manufactured more easily at the desired accuracy.

Furthermore, such a high precision edge, as one possible variant to support the facet element, allows easy implementation of a further aspect of the disclosure, namely the use of negative pressure acting on the facet element to generate a contact load between the support element and the facet element. This has the advantage that the contact load (eventually adjustable via a corresponding adjustment of the negative pressure) generates a resistance against manipulation forces reducing the effort, in particular the number and/or complexity of the manipulators, to adjust the facet element.

In one aspect, a facet mirror device includes a facet element and a support element which supports the facet element. The facet element includes a curved first support section while the support element includes a second support section which forms a support edge that contacts the first support section in a region of contact to support the facet element.

In another aspect, an optical imaging arrangement includes a mask unit adapted to receive a pattern, a substrate unit adapted to receive a substrate, an illumination unit adapted to illuminate the pattern, and an optical projection unit adapted to transfer an image of the pattern onto the substrate. At least one of the illumination unit and the optical projection unit includes a facet mirror device. The facet mirror device includes a facet element and a support element which supports the facet element. The facet element includes a curved first support section, and the support element includes a second support section which forms a support edge contacting the first support section in a region of contact to support the facet element.

In a further aspect, a method of supporting a facet element of a facet mirror device includes providing a facet element and a support element, and supporting the facet element at a curved first support section of the facet element via a second support section of the support element which forms a support edge contacting the first support section in a region of contact to support the facet element.

In another aspect, a method of manufacturing a facet mirror device includes, in a preparation step, providing a facet element and a support element. The facet element has a front surface which is optically used during operation of the facet mirror device, and the facet element has a rear surface which includes a curved first support section. The support element has a second support section forming a support edge. In a supporting step, the facet element is placed onto the support element such that the a curved support edge contacts the first support section in a region of contact to support the facet element.

In a further aspect, a method of manufacturing a facet mirror device includes, in a preparation step, providing a facet element and a support element. The facet element has a front surface which is optically used during operation of the facet mirror device, and the facet element has a rear surface including a curved first support section. The support element has a second support section. In a supporting step, the facet element is placed onto the support element such that the second support section contacts the first support section in a region of contact to support the facet element. In a contacting step of the supporting step, a negative pressure is generated, and the negative pressure acts on a part of the rear surface of the facet element such that the first support section is pressed against the second support section.

Further aspects and embodiments of the disclosure will become apparent from the dependent claims and the following description of preferred embodiments which refers to the appended figures. All combinations of the features disclosed, whether explicitly recited in the claims or not, are within the scope of the disclosure.

DETAILED DESCRIPTION

First Embodiment

In the following, a first preferred embodiment of an optical imaging arrangement 101 according to the disclosure will be described with reference to FIGS. 1 to 10. In order to facilitate the explanations given below an x,y,z-coordinate system has been introduced into the Figures and will be used throughout the following description. In the following, the z-direction designates the vertical direction. However, it will be appreciated that, with other embodiments of the disclosure, any other orientation in space of this x,y,z-coordinate system and the components of the optical imaging arrangement, respectively, may be chosen.

Figure 1:
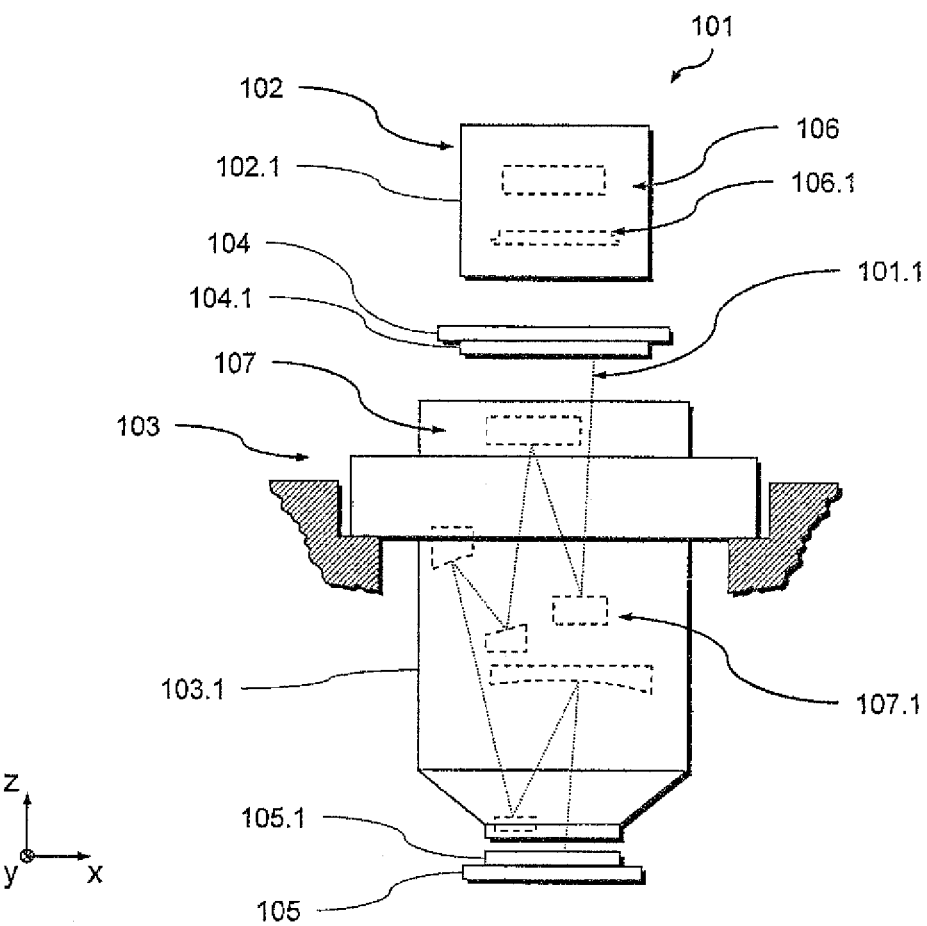
FIG. 1 is a schematic representation of a preferred embodiment of an optical imaging arrangement according to the disclosure which includes a preferred embodiment of a facet mirror device according to the disclosure and with which preferred embodiments of methods according to the disclosure may be executed.

FIG. 1 is a schematic and not-to-scale representation of the optical imaging arrangement in the form of an optical exposure apparatus 101 used in a microlithography process during manufacture of semiconductor devices. The optical exposure apparatus 101 includes an illumination unit 102 and an optical projection unit 103 adapted to transfer, in an exposure process, an image of a pattern formed on a mask 104.1 of a mask unit 104 onto a substrate 105.1 of a substrate unit 105. To this end, the illumination unit 102 illuminates the mask 104.1. The optical projection unit 103 receives the light coming from the mask 104.1 and projects the image of the pattern formed on the mask 104.1 onto the substrate 105.1, e.g. a wafer or the like.

The illumination unit 102 includes an optical element system 106 (only shown in a highly simplified manner in FIG. 1) including a plurality of optical element units such as optical element unit 106.1. As will be explained in further detail below, the optical element unit 106.1 is formed as a preferred embodiment of a facet mirror device according to the disclosure. The optical projection unit 103 includes a further optical element system 107 including a plurality of optical element units 107.1. The optical element units of the optical element systems 106 and 107 are aligned along a folded optical axis 101.1 of the optical exposure apparatus 101.

In the embodiment shown, the optical exposure apparatus 101 operates using light in the EUV range at a wavelength between 5 nm to 20 nm, more precisely at a wavelength of 13 nm. Thus, the optical elements used within the illumination unit 102 and the optical projection unit 103 are exclusively reflective optical elements. However, it will be appreciated that, with other embodiments of the disclosure working at different wavelengths, any type of optical elements (refractive, reflective or diffractive) may be used alone or in an arbitrary combination. The optical element system 107 may include a further facet mirror device according to the disclosure.

Figure 5:
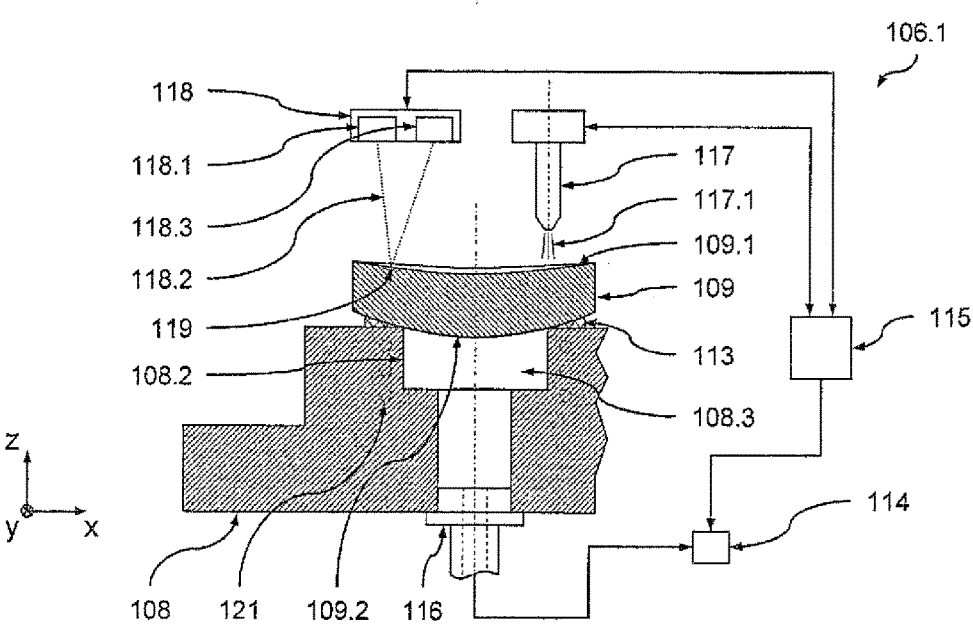
FIG. 5 is a schematic sectional representation of the part of the facet mirror device of FIG. 2 in a second manufacturing stage.
Figure 6:
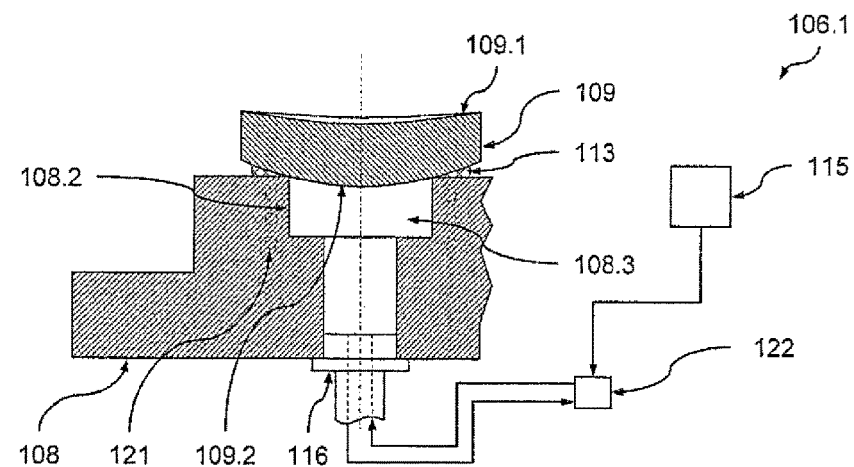
FIG. 6 is a schematic sectional representation of the part of the facet mirror device of FIG. 2 during operation of the optical imaging arrangement of FIG. 1.
Figure 7:
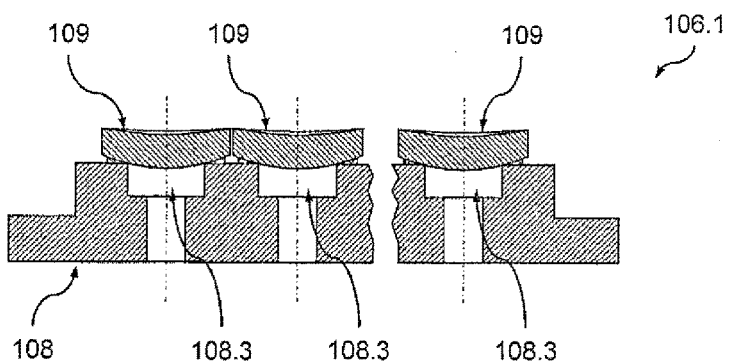
FIG. 7 is a schematic sectional representation of the facet mirror device of FIGS. 2 to 6 (in a section along line VII-VII of FIG. 8)
Figure 8:
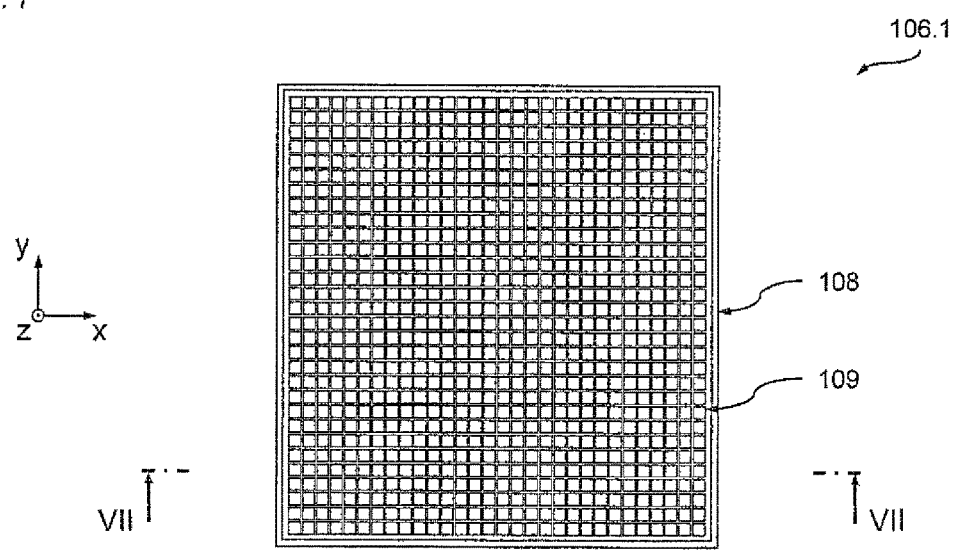
FIG. 8 is a schematic top view of the facet mirror device of FIGS. 2 to 7.

As can be seen from FIGS. 2 to 9, in particular from FIGS. 7 and 8, the facet mirror device 106.1 includes a support element 108 supporting a plurality of facet elements 109. In the embodiment shown 900 facet elements 109 are supported on the support element 108. However, it will be appreciated that, with other embodiments of the disclosure, at any other number of facet elements 109 may be carried by the support element 108. For example, with certain preferred embodiments of the disclosure, up to 2000 facet elements 109 or even more are supported on the support element 108.

In the embodiment shown, the facet elements 109 are arranged such that a small gap of less than 0.05 mm is left between them. Hence, as can be seen in particular from FIG. 8, a regular rectangular matrix of facet elements 109 is formed on the support element 108 providing a minimum amount of loss in radiant power. However, it will be appreciated that, with other embodiments of the disclosure, any other arrangement of facet elements may be chosen according to the desired optical properties of the imaging device, the facet mirror device is used for.

As can be further seen from FIGS. 2 to 9, in particular from FIG. 8, each facet element 109, in a top view (along the z-direction), has an outer contour of substantially rectangular shape, more precisely of substantially squared shape. However, with other embodiments of the disclosure, any other geometry of this outer contour may be chosen such as, for example, an arbitrarily curved outer contour, a circular outer contour, an elliptic outer contour, a polygonal outer contour or arbitrary combinations thereof.

In the embodiment shown, each facet element has a concave front surface 109.1, a convex rear surface 109.2 and a lateral surface 109.3. The front surface 109.1 is a reflective surface optically used during operation of the optical imaging arrangement 101 in order to provide homogenization of the exposure light provided by the illumination unit 102. The reflective surface 109.1 may be provided via a reflective coating applied to the front surface 109.1 which is adapted to the wavelength of the exposure light used (typically, in order to provide maximum reflectivity at the respective wavelength).

In the embodiment shown, the front surface 109.1 is a spherical surface. However, it will be appreciated that, with other embodiments of the disclosure, any other shape of the front surface may be chosen depending on the optical task to be performed by the facet mirror device. Hence, apart from such spherical surfaces, aspherical as well as planar surfaces as well as arbitrary combinations thereof may be used. Furthermore, convex front surfaces may also be used.

Furthermore, in the embodiment shown, the rear surface 109.2 also is a spherical surface which is free from any protrusions radially protruding beyond this spherical surface defined by the first support section 109.4 of the rear surface 109.2. On the one hand, this has the advantage that the parts of the rear surface 109.2 contacting the support element 108 (i.e. the first support section 109.4) and the parts of the rear surface 109.2 reaching into the recess 108.3 may be easily produced in a typical, well-established lens manufacturing process providing excellent accuracy of the rear surface 109.2.

Using such well-established lens manufacturing processes the radius of curvature of the front surface 109.1 and the rear surface 109.2, the outer contour of the lateral surface 109.3, the centering of the facet element 109, the central as well as the lateral thickness (dimension in the z-direction) may be manufactured at a very high precision using such conventional lens manufacturing techniques.

On the other hand, since (other than with the known designs mentioned initially) no radially protruding manipulating levers or the like are mounted to the rear surface 109.2, there is no risk that such a mounting process introduces deformations adversely affecting the geometric accuracy of the rear surface 109.2.

In the embodiment shown, a part of the rear surface 109.2 of the facet element 109 forms a spherical first support section 109.4 contacting a second support section formed by a support edge 108.1 of the support element 108. The support edge 108.1 is formed at an end of a cylindrical wall 108.2 confining a cylindrical recess 108.3 within the support element 108.

Figure 9:
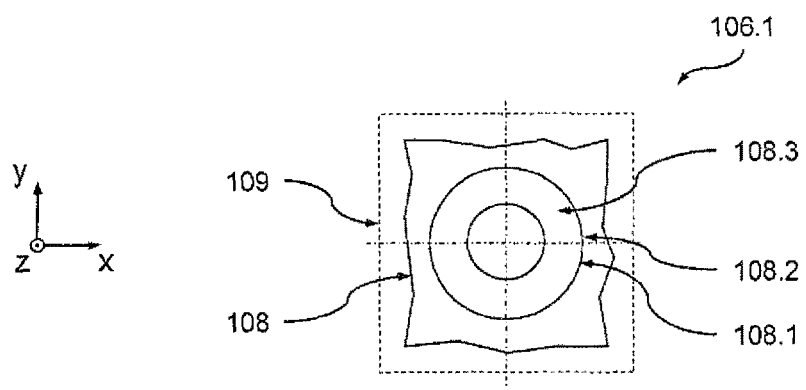
FIG. 9 is a schematic top view of a part of the support element the facet mirror device of FIGS. 2 to 8.

As can be seen from FIG. 9, the recess 108.3 is of circular cross-section, such that the curvature of the support edge 108.1 in the xy-plane corresponds to the curvature of the rear surface 109.2 in the region of contact between the first support section 109.4 and the second support section, i.e. the support edge 108.1.

Furthermore, the support edge 108.1 is formed as a sharp edge having an edge radius, i.e. a minimum radius of curvature, which is less than 0.5 mm to 3 mm. Preferably, the edge radius ranges from 1.0 mm to 2.0 mm. This minimum radius of curvature is measured in a radial plane which, in the embodiment shown, contains the axis 108.4 of the recess 108.3.

It will be appreciated that, typically, the edge radius is about 5% to 20%, preferably about 10% to 15%, of the maximum dimension of the facet element 109 in its plane of main extension (here: xy-plane). In the embodiment shown, this maximum dimension is about 5 mm to 10 mm, although smaller or larger dimensions may be chosen depending on the desired optical properties for the facet mirror device.

The use of such a sharp support edge 108.1 has the advantage that the support edge 108.1 may be easily manufactured at very high precision. The only comparatively simple manufacturing steps to be taken are to provide the cylindrical recess 108.3 and a planar upper surface 108.5 of the support element 108. Both operations may be comparatively easily performed at very high precision. For example, high precision manufacturing techniques such as chemical-mechanical polishing (CMP), pitch polishing, magneto-rheological fluid polishing (MRFP) and robotic polishing may be used when producing the support edge 108.1.

Hence, in the embodiment shown, a distance tolerance between axes 108.4 of adjacent recesses 108.3 of a few microns, typically about 5 µm, may be obtained. Furthermore, the angular deviation of the axis 108.4 from a surface normal on the upper surface 108.5 is less than 0.005°.

Figure 3:
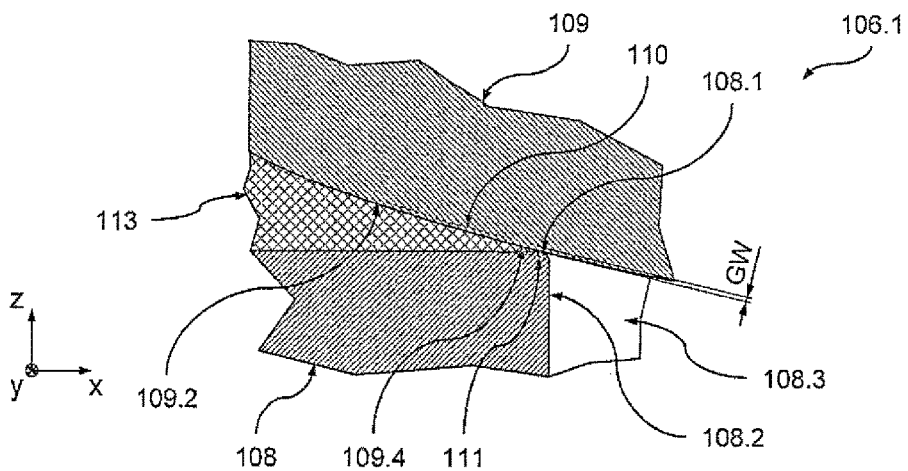
FIG. 3 is a schematic sectional representation of the detail III of FIG. 2.

Consequently, generally, a continuous annular line contact exists between the spherical first support section 109.4 of the rear surface 109.2 and the continuous ring-shaped support edge 108.1. Obviously, manufacturing tolerances (as indicated in FIG. 3 by the dashed contours 110 and 111) may still lead to a deviation from this (ideal) line contact. However, in the embodiment shown, the support edge and the facet element are manufactured at a manufacturing accuracy which is selected such that, at any edge point of support edge 108.1, a width GW of a manufacturing tolerance related local gap between the support edge 108.1 and the rear surface 109.2 of the facet element 109 is less than 0.5 µm to 10 µm, preferably less than 1 µm to 5 µm. As shown in FIG. 3, this gap width GW is the dimension in a direction of a surface normal of the rear surface 109.2 extending through the respective edge point.

As will be explained now in greater detail with reference to FIGS. 2 to 10 the facet mirror device 106.1 is manufactured according to a preferred embodiment of the method according to disclosure using a preferred embodiment of the method of supporting a facet element according to the disclosure.

Figure 10:
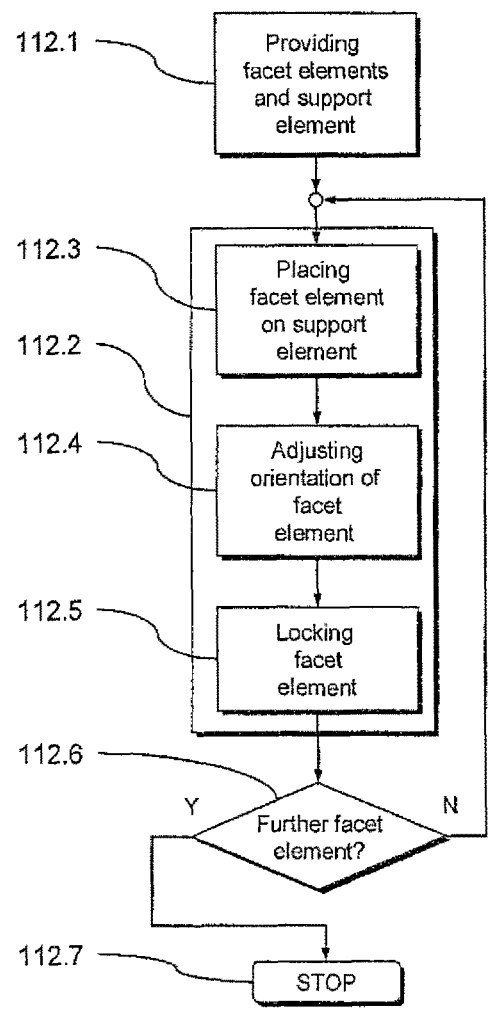
FIG. 10 is a block diagram of a preferred embodiment of a method of manufacturing a facet mirror device including a preferred embodiment of a method of supporting the facet element according to the disclosure which may be used for the optical imaging arrangement of FIG. 1.

According to FIG. 10, in a preparation step 112.1, the support element 108 and the facet elements 109 are manufactured as it has been outlined above. In the embodiment shown, the facet elements are made of silicon (Si), while the support element is made of silicon carbide (SiC). With such a material pairing and beneficial heat transfer from the facet elements 109 (typically reaching temperatures of 100° C. to 150° C. during operation of the imaging arrangement 101) may be obtained.

However, it will be appreciated that, with other embodiments of the disclosure, the facet element may be made of silicon carbide (SiC), quartz ($SiO_2$), nickel plated copper or steel, while the support element may be made of silicon infiltrated silicon carbide (SiSiC) or tungsten carbide (WC).

Figure 4:
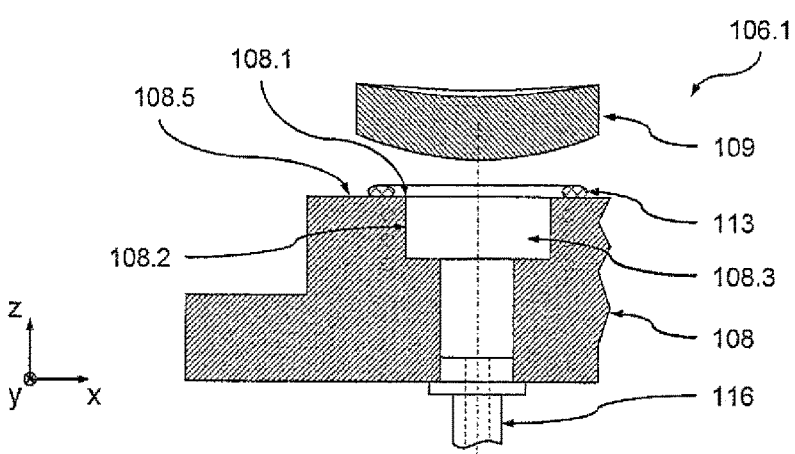
FIG. 4 is a schematic sectional representation of the part of the facet mirror device of FIG. 2 in a first manufacturing stage.

Then, in a contacting step 112.3 of a supporting step 112.2, a facet element 109 is placed from above along the z-direction on the support edge 108.1 (using a suitable handling device not shown) after a ring of an adhesive bonding material 113 has been placed on the upper surface 108.5 of the support element 108 adjacent to the support edge 108.1 (see FIG. 4).

Slightly before or after the facet element 109 has been placed on the support edge 108.1 a negative pressure is generated within the recess 108.3 using a suction device 114 controlled by a control device 115. To this end, the suction device 114 is connected to a connector 116 which in turn is connected to a connector section 108.6 of the wall 108.2.

This negative pressure within the recess 108.3 has the effect that the rear surface 109.2 of facet element 109 is pressed against the support edge 108.1 holding the facet element in place without any need for additional manipulators, clamping devices etc. The high precision of the support edge 108.1 and the rear surface 109.2 themselves (due to the only very small gap present in the worst case) already guarantee that even only a slight negative pressure within the recess 108.3 is sufficient to reliably generate a well-defined line load between the support edge 108.1 and facet element 109 reliably holding the latter in place.

Furthermore, even if there was a gap (with a gap width GW) due to manufacturing tolerances, the adhesive material 113 would be sucked into this gap sealing the latter. Hence, in any case, the negative pressure generated by the suction device 114 provides proper holding forces holding the facet element 109 in place.

In the embodiment shown, the suction device 114 generates a pressure of about $5 \cdot 10^{-3}$ mbar within the recess 108.3. However, it will be appreciated that, with other embodiments of the disclosure, any other pressure level may be provided in the recess, the pressure level being selected as a function of the forces to be generated for holding the facet element in place.

It will be appreciated that the viscosity of the adhesive material 113 may be selected sufficiently high to avoid excess intake of adhesive material 113 into the recess 108.3 through such eventual gaps. Hence, in any case, the adhesive material forms a sealing ring (at least predominantly) located outside the recess 108.3 (i.e. on a side of the support edge 108.1 facing away from the recess 108.3) and surrounding the contact region between the facet element 109 and the support element 108 (see e.g. FIGS. 2 and 4 to 7).

Then, in an adjustment step 112.4 of the supporting step 112.2, the orientation of the facet element 109 with respect to the support element 108 is adjusted according to the desired optical properties for the facet mirror device 106.1 during later operation in the imaging arrangement 101.

To this end, a contactless manipulator 117 controlled by the control device 115 is used to generate a corresponding adjustment force on the front surface 109.1 of the facet element 109 as it is shown in FIG. 5. The manipulator is a pneumatic manipulator generating a jet of air 117.1 expelled towards the front surface 109.1 thereby exerting an adjustment force on the facet element 109. Under the control of the control device 115 a relative motion may be generated between the manipulator 117 and the facet mirror device 106.1 is such that the manipulation force F generated by the jet of air 117.1 may act on the facet element 109 at the appropriate location to provide proper adjustment of the latter.

However, it will be appreciated that, with other embodiments of the disclosure, and any other contactless or contact type manipulator (such as a tactile manipulator, a cantilever spring manipulator etc) or combinations thereof may be chosen to exert the adjustment force on to the facet element. In particular, as a further contactless manipulator an acoustic manipulator may be used generating standing acoustic waves, the acoustic pressure of which generating the manipulating force F acting on the facet element.

Assessment of the adjustment of the optically used front surface 109.1 is performed using the measurement results of a measurement device 118. In the present embodiment, the measurement device 118 is an optical device including an emitter 118.1 emitting a measurement light beam 118.2 towards the front surface 109.1. The measurement light beam 118.2 is reflected at the front surface 109.1 and reaches a sensor 118.3 of the measurement device 118.

In the embodiment shown, the emitter is a conventional emitter using measurement light at a wavelength of 633 nm. Hence, it may be desirable to provide a measurement section 119 at the front surface 109.1 having a reflective coating adapted to this wavelength of the measurement light (provided that the reflective coating of the front surface 109.1 adapted to the exposure light does not provide sufficient reflection at the measurement light wavelength). However, it will be appreciated that, with other embodiments of the disclosure, other wavelengths may be used for the measurement light, such that, eventually, no such additional measurement section may be involved.

The signals of the sensor 118.3 are forwarded to the control device 115 which, in turn, performs the assessment of the adjustment of the front surface 109.1 using these signals. It will be appreciated that the control device 115, as a function of the signals of the sensor 118.3, controls the suction device 114 and the manipulator 117 to provide rapid proper adjustment of the front surface 109.1.

It will be appreciated that, in the embodiment shown, the front surface 109.1 is adjusted at an angular accuracy of less than 100 μrad. However, it will be appreciated that, with other embodiments of the disclosure, depending on the desired optical properties during later operation of the imaging arrangement 101, any other angular accuracy may be chosen.

For example, under the control of the control device 115, the negative pressure within the recess 108.3 may be reduced to reduce the holding force exerted on the facet element 109. This in turn reduces the amount of the manipulation force to be exerted by the manipulator 117 in order to achieve an adjustment movement of the front surface 109.1. On the other hand, once it has been detected that the proper alignment of the front surface 109.1 has been achieved, the control device 115 may cause the suction device 114 to increase the negative pressure to securely hold the facet element in place.

Consequently, in a highly beneficial way, this suction device 114 forms a holding device generating the negative pressure in the recess 108.3 which in a very simple, contactless manner generates a stabilizing contact force between the facet element 109 and the support element 108. This contact force in turn leads to an adjustable resistance against dislocation of the facet element 109 without any risk of dislocating the facet element 109 due to a malfunction of the holding device.

It will be appreciated that this stabilizing effect may be achieved in a very simple manner using the specific design of the support element 108 with the support edge 108.1 as outlined above. However, the inventive concept of generating a negative pressure acting on the facet element to hold the latter in place is independent of the design of the cooperating support sections of the support element and the facet element as long as a sufficiently air tight connection between the support sections is exists such that the negative pressure may generate the stabilizing contact force between the support element and the facet element.

Once the adjustment of the facet element 109 is completed, in a facet fixation step 112.5 of the supporting step 112.2, the facet element 109 is fixed in place by curing the adhesive bonding material 113 such that a fixed adhesive connection is established between the facet element 109 and the support element 108. However, it will be appreciated that, with other embodiments of the disclosure, apart from the gluing technique as outlined above, any other suitable bonding technique may be used alone or in arbitrary combination to provide proper connection and relative fixation between the facet elements and the support element. Such suitable bonding techniques include, for example, soldering, laser soldering, welding, laser welding, diffusion bonding etc. It will be appreciated that, if diffusion bonding is used, the negative pressure in the recess 108.3 may be increased to at least support the contact pressure in the bonding process.

It will be appreciated that, with other embodiments of the disclosure, the bonding material 113 may also be applied at any point in time during or after the adjustment of the facet element as it has been outlined above.

It will be further appreciated that the adhesive material 113 may be selected to have a high thermal conductivity such that good heat transfer from the facet element 109 to the support element 108 achieved. Furthermore, in cases where high thermal conductivity of the bond between the facet element and the support element is crucial, other bonding techniques (e.g. soldering, welding, diffusion bonding) providing better heat transfer may be used.

In a step 112.6 it is then checked if a further facet element 109 is to be mounted to the support element 108. If this is the case the method jumps back to step 112.3 for executing the supporting step for the next facet element 109 to be mounted. Otherwise, the method ends in step 112.7

In certain embodiments of the present disclosure, at the end of the fixation step 112.5 or at any later point in time (in particular after mounting all of the facet elements 109), the recess 108.3 may be filled with a liquid heat transfer medium having high thermal conductivity to improve heat transfer from the facet element 109 to the support element 108. To this end, the recess 108.3 may be sealed using a cap 120 as it is shown in FIG. 2.

Figure 2:
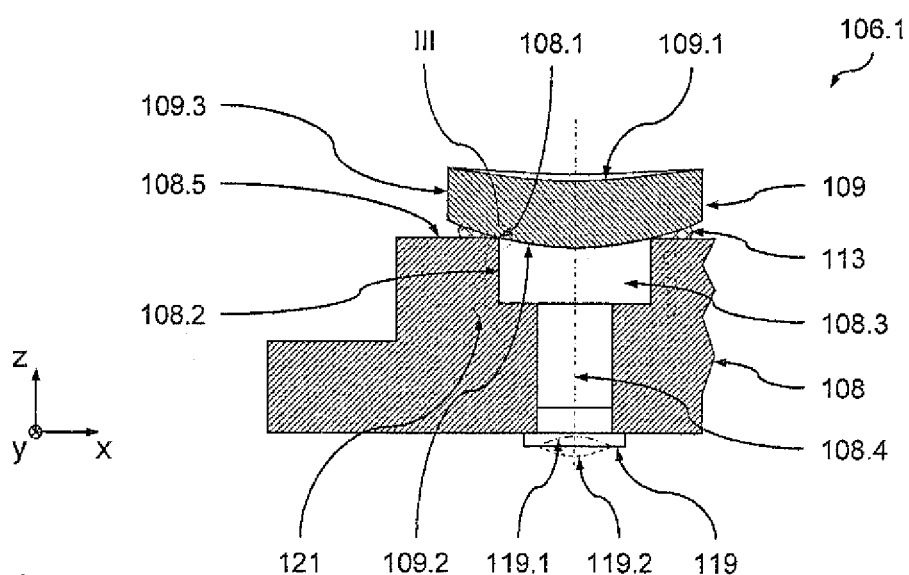
FIG. 2 is a schematic sectional representation of a part of a facet mirror device according to the disclosure, the facet mirror device being a part of the optical imaging arrangement of FIG. 1 (in a section along line VII-VII of FIG. 8)

The cap 120 may be provided with an elastic portion compensating thermal expansion of the heat transfer medium by elastic deformation as it is indicated in FIG. 2 by the contours 120.1 and 120.2. With this approach excessive load on the facet element 109 (caused by such a thermal expansion of the heat transfer medium) can be avoided which might otherwise lead to an undesired deformation of the facet element 109, in particular the reflective front surface 109.1 optically used during operation.

It will be appreciated that this introduction of a heat transfer medium into the respective recess 108.3 may be a one-time operation since the ring-shaped adhesive material 113 and the cap 120 provide long-term sealing of the recess 108.3. However, regular exchange refill of the heat transfer medium may be provided (e.g. via the cap 120) if desired.

Heat removal from the facet mirror device 106.1 during operation of the imaging arrangement 101 may be achieved using a cooling medium circulating through cooling channels as they are indicated by the dashed contours 121 (see e.g. FIGS. 2 to 6).

With further embodiments of the disclosure, the respective recess 108.3 itself forms part of a cooling channel system, wherein, during operation of the imaging arrangement 101, a cooling medium is circulated by a cooling device 122 (controlled by the control device 115) connected to the recess 108.3 via the connector 116 as it is shown in FIG. 6.

With certain embodiments of the disclosure, e.g. at a later stage after initial manufacture of the facet mirror device 106.1 repair and exchange of one or more facet elements 109 may be executed using repair variants of the methods as outlined above.

To this end, in a dismounting step of the preparation step 112.1, a thermal load may be applied to the respective facet element 109 to be repaired or exchanged. This thermal load is selected to cause a sufficiently high and/or rapid thermal expansion difference between the facet element 109 and the support element 108 causing failure (e.g. fracture or disintegration) of the bonding material 113. At this stage, the facet element 109 may then be removed from the support element 108. This step may be repeated for any facet element 109 to be removed.

Furthermore, in a further working step of the preparation step 112.1, the support element may be worked (e.g. removing any residue of the broken or disintegrated bonding material 113) in order to allow mounting of replacement facet element 109. Once this is done, the method may proceed to step 112.2 and be executed as it has been outlined above to mount a replacement facet element 109 for any facet element 109 removed previously.

Second Embodiment

In the following, a second embodiment of the facet mirror device 206.1 according to the disclosure will be described with reference to FIGS. 11 to 13. The facet mirror device 206.1 in its basic design and functionality largely corresponds to the facet mirror device 106.1 and may replace the facet mirror device 106.1 in the optical imaging device 101 of FIG. 1. In particular, the method of supporting a facet element and the method of manufacturing the facet mirror device as they have been described above in relation to the first embodiment (FIG. 10) may be executed as well in the context of this facet mirror device 206.1. Thus, it is here mainly referred to the explanations given above and only the differences with respect to the facet mirror device 106.1 will be explained in further detail. In particular, similar parts are given the same reference numeral raised by the amount 100 and (unless explicitly described in the following) in respect to these parts reference is made to the explanations given above in the context of the first embodiment.

The only difference with respect to the facet mirror device 106.1 lies within the fact that the support edge 208.1 is provided with eight small radial slots 208.7 (evenly distributed at the circumference of the support edge 208.1). Hence, the support edge 208.1 is a segmented edge including eight support edge segments 208.8 mutually separated by one of the radial slots 208.7. However, it will be appreciated that, with other embodiments of the disclosure, any other number and/or arrangement of the radial slots may be chosen.

Figure 11:
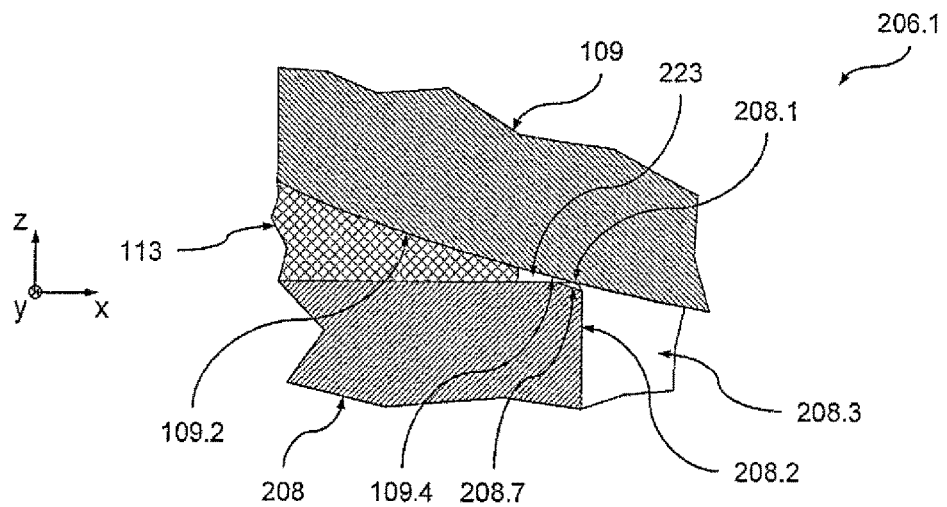
FIG. 11 is a schematic sectional representation of a detail of a further preferred embodiment of a facet mirror device according to the disclosure in a first manufacturing stage.
Figure 12:
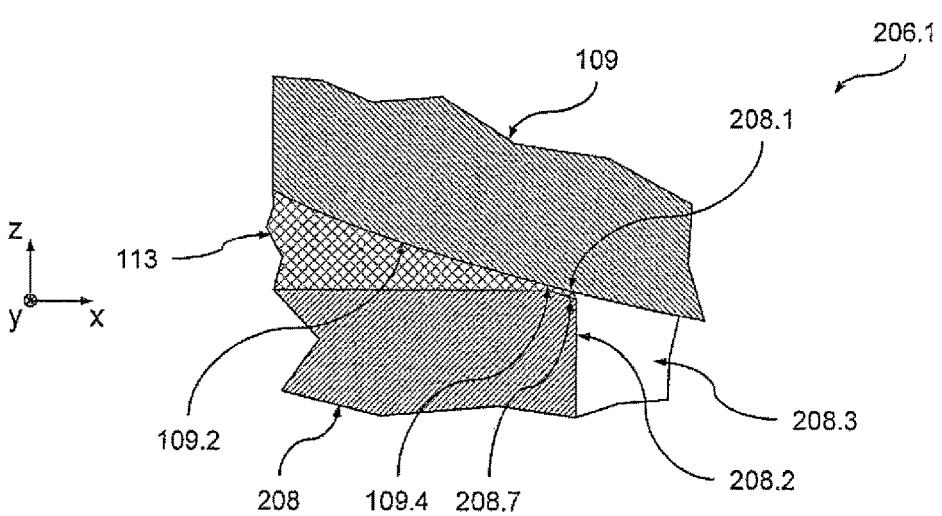
FIG. 12 is a schematic sectional representation of the detail of FIG. 11 in a second manufacturing stage.
Figure 13:
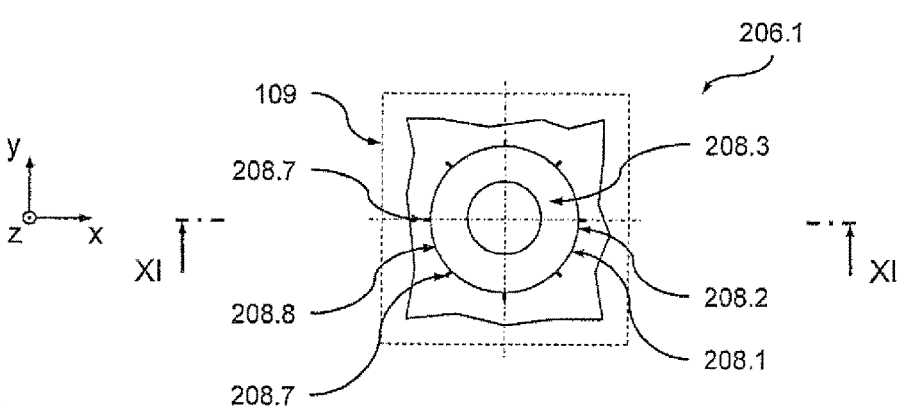
FIG. 13 is a schematic top view of a part of the support element the facet mirror device of FIGS. 11 and 12.

As can be seen from FIGS. 11 and 12 were radial slots 208.7 and the fact that the negative pressure within the recess 208.3 draws off any inclusions of air 223 (see FIG. 11) between the adhesive material 113 and the contact region between the rear surface 109.2 of the facet element 109 and the support edge 208.1.

In the embodiment shown, the dimensions of the respective radial slot 208.7, the viscosity of the adhesive material 113 and the negative pressure are mutually adapted such that, on the one hand, the adhesive material is partially drawn into the respective slot 208.7 about that, on the other hand, no substantial intake of adhesive material 113 into the recess 208.3 takes place.

Such a configuration has the advantage that a comparatively large surface of both the support element of 208 and the rear surface 109.2 of the facet element 109 is reliably and fully wetted by the adhesive material leading to a good adhesive contact between the adhesive material 113 and the facet element 109 and the support element 208, respectively.

In the foregoing, the disclosure has been described in the context of a plurality of embodiments where the first support section on the rear surface of the facet element is a spherical surface while the support edge is a planar circular edge. However, it will be appreciated that, with other embodiment of the disclosure, any other design with mating (arbitrary) curvatures between the first support section and the support edge may be chosen. For example, a configuration may be chosen wherein the first support section on the rear surface of the facet element is a cylindrical surface contacting a curved support edge (substantially extending along the circumference of the cylindrical surface). In addition or as an alternative the cylindrical surface of the first support section may contact at least one straight support edge (substantially extending parallel to the longitudinal axis of the cylindrical surface).

In the foregoing, the disclosure has been described in the context of embodiments where the optical module according to the disclosure is used in the illumination unit. However, it will be appreciated that the optical module according to the disclosure may provide its beneficial effects as well in the optical projection unit.

In the foregoing, the disclosure has been described in the context of embodiments working in the EUV range. However, it will be appreciated that the disclosure may also be used at any other wavelength of the exposure light, e.g. in systems working at 193 nm etc.

Finally, in the foregoing, the disclosure has been described solely in the context of microlithography systems. However, it will be appreciated that the disclosure may also be used in the context of any other optical device using facet mirror devices.

What is claimed is:

1. A facet mirror device, comprising:
a facet element including a curved section; and
a support element including a wall having a first surface and an end, the first surface defining a recess in the support element, a second surface of the support element being inclined with respect to the first surface and meeting the first surface at the end of the wall to provide a support edge,
wherein the support edge contacts the curved section in a contact region to support the facet element so that the facet element is tiltable relative to the support element.

2. The facet mirror device of claim 1, wherein:
the contact region has a first curvature, and the support edge has a second curvature so that generally a line contact exists between the support edge and the facet element; and
at least one of the following holds:
the support edge includes at least one edge segment;
the support edge is a continuous ring shaped edge;
the wall confines a recess within the support element;- and
the curved section has a spherical surface in the contact region.

3. The facet mirror device of claim 1, wherein at least one of the following holds:
the facet element is connected to the support element by an adhesive bond;
the facet element is connected to the support element via a bonding material located adjacent to the support edge;
the facet element is adhesively connected to the support element in a region between the support edge and the curved section; and
the facet element is glued, soldered, laser soldered, welded, laser welded and/or diffusion bonded to the support element.

4. The facet mirror device of claim 3, wherein at least one of the following holds:
at least a majority of the bonding material is at a side of the support edge facing away from the recess; and
the bonding material seals a gap between the facet element and the support element.

5. The facet mirror device of claim 1, wherein at least one of the following holds:
the support edge is a sharp edge defining a minimum edge radius of curvature less than 3 mm; and
a width of a manufacturing tolerance related gap between the support edge and the facet element is less than 10 µm.

6. The facet mirror device of claim 1, wherein the facet element includes an at least partially reflective front surface and a rear surface, and the curved section is part of the rear surface,
and wherein at least one of the following holds:
the rear surface is substantially free from protrusions;
the curved section defines a continuously curved shell, and the rear surface is substantially free from protrusions protruding from the rear surface beyond the spherical shell;
the front surface of the facet element includes a reflective surface area adapted to be used in an orientation adjustment operation during mounting of the facet element to the support element; and
the front surface of the facet element has an outer contour that is section wise curved and/or section wise polygonal.

7. The facet mirror device of claim 1, wherein at least one of the following holds:
the facet element comprises a material selected from the group consisting of silicon, silicon carbide, quartz, nickel plated copper and steel; and
the support element comprises a material selected from the group consisting of silicon carbide, silicon infiltrated silicon carbide and tungsten carbide.

8. The facet mirror device of claim 1, wherein at least one of the following holds:
the wall confines a recess within the support element, the wall includes a connector section adapted to connect a suction mechanism to the recess to generate a negative pressure within the recess so that the negative pressure adjustably fixes the facet element relative to the support element during mounting of the facet element to the support element;
the support element includes at least one cooling duct; and
the wall confines a recess within the support element, the recess is filled with a cooling medium or a heat transfer medium.

9. The facet mirror device of claim 1, wherein:
the facet mirror comprises a plurality of further facet elements, the support element includes a plurality of further support edges, and each of the further support edges supports a corresponding one of the plurality of further facet elements; or
the facet mirror device comprises a least 1000 facet elements, and the support element supports the at least 1000 facet elements.

10. The facet mirror device of claim 1, wherein the second surface intersects the first surface of the wall to define, in a sectional plane extending transverse to the first surface of the wall, a vertex, and the support edge is at the vertex.

11. The facet mirror device of claim 1, wherein a line contact exists between the support edge and the curved section.

12. An optical imaging arrangement, comprising:
an illumination unit adapted to illuminate a pattern of a mask; and
an optical projection unit adapted to transfer an image of the pattern onto a substrate,
wherein:
the illumination unit comprises a facet mirror device, and/or the optical projection unit comprises a facet mirror device; and
wherein the facet mirror device comprises:
a facet element including a curved section;
a support element including a support edge contacting the curved section in a contact region to support the facet element so that the facet element is tiltable relative to the support element;
the support edge is at an end of a wall of the support element; and
the support element has mutually inclined first and second surfaces meeting at the end of the wall to provide the support edge.

13. The optical imaging arrangement of claim 12, wherein the second surface intersects the first surface of the wall to define, in a sectional plane extending transverse to the first surface of the wall, a vertex, and the support edge is at the vertex.

14. The optical imaging arrangement of claim 12, wherein a line contact exists between the support edge and the curved section.

15. A method, comprising:
contacting a curved portion of a facet element with a support edge of a support element to provide a facet mirror device,
wherein:
the support edge is at an end of a wall of the support element;
the wall has a first surface which defines a recess in the support element;
a second surface of the support element is inclined with respect to the first surface and extends away from the end of the wall to provide the support edge; and
the support edge contacts the curved section to support the facet element so that the facet element is tiltable relative to the support element.

16. The method according to claim 15, wherein at least one of the following holds:
the facet element is connected to the support element by an adhesive bond;
the facet element is connected to the support element via a bonding material located adjacent to the support edge;
the facet element is adhesively connected to the support element in a region of contact between the support edge and the curved portion; and
the facet element is connected to the support element by at least one bonding technique selected from the group consisting of gluing, soldering, laser soldering, welding, laser welding, diffusion bonding.

17. The method of claim 16, wherein at least one of the following holds:
a majority of the bonding material is located at a side of the support edge facing away from the recess;
the bonding material seals a gap between the facet element and the support element; and
the recess is filled with a cooling medium or a heat transfer medium.

18. The method of claim 15, wherein the second surface intersects the first surface of the wall to define, in a sectional plane extending transverse to the first surface of the wall, a vertex, and the support edge is at the vertex.

19. The method of claim 15, wherein a line contact exists between the support edge and the curved section.

20. A method of making a facet mirror device, the method comprising:
a) providing a facet element and a support element, the facet element having a front surface optically used during operation of the facet mirror device, the facet element having a rear surface including a curved section, and the support element having a wall with a first surface that defines a recess in the support element, a second surface of the support element being inclined with respect to the first surface and extending from an end of the wall of the support element to provide a support edge; and b) placing the facet element onto the support element such that the support edge contacts the curved section to support the facet element so that the facet element is tiltable relative to the support element.

21. The method of claim 20, wherein b) comprises at least one of the following:

generating a negative pressure which acts on a part of the rear surface of the facet element such that the curved section is pressed against the support edge;

adjusting a position and/or an orientation of the facet element with respect to the support element according to desired optical properties to be achieved during operation of the facet mirror device; and fixing the facet element with respect to the support element.

22. The method of claim 21, comprising:

generating the negative pressure in the recess within the support element;

maintaining at least a fraction of the negative pressure such that the adjustment is to be performed against a resistance resulting from a contact load between the support edge and the facet element;

at least temporarily increasing the negative pressure upon completion of the adjustment to secure the facet element against relative motion with respect to the support element; and generating an adhesive bond between the facet element and the support element, wherein at least one of the following holds:

the facet element is connected to the support element by at least one bonding technique selected from a group of bonding techniques consisting of gluing, soldering, laser soldering, welding, laser welding, diffusion bonding; and the recess is filled with a cooling medium or a heat transfer medium.

23. The method of claim 22, comprising locating a bonding material adjacent to the support edge, wherein at least one of the following holds:

the bonding material at least one of contacts the facet element and the support element and seals a gap between the facet element and the support element; and a majority of the bonding material is located at a side of the support edge facing away from the recess.

24. The method of claim 21, wherein at least one of the following holds:

a manipulator is used to provide the adjustment, and the manipulator interacts with at least one of the front surface and a lateral surface of the facet element;

a manipulator is used to provide the adjustment, and the manipulator is selected from the group consisting of a tactile manipulator, a cantilever spring manipulator, a contactless acoustic manipulator and a contactless pneumatic manipulator; and a measurement unit is used to provide signals representative of an actual adjustment of the facet element, and the measurement unit is selected from the group consisting of a tactile measurement unit contacting a surface of the facet element, a contactless measurement unit cooperating with the facet element and an optical measurement cooperating with a reflective surface section of the facet element.

25. The method of claim 20, wherein at least one of the following holds:

the facet element comprises a material selected from a first material group consisting of silicon, silicon carbide, quartz, nickel plated copper and steel;

the support element comprises a material selected from a second material group consisting of silicon carbide, silicon infiltrated silicon carbide and tungsten carbide;

the support edge is formed using a working technique selected from a group of working techniques consisting of polishing, chemical-mechanical polishing, pitch polishing, magneto-rheological fluid polishing and robot polishing;

the support edge is formed as a sharp edge defining a minimum edge radius of curvature less than 3 mm; and the support edge and the facet element are manufactured at a manufacturing accuracy, the manufacturing accuracy being selected such that, at any edge point of the support edge, a width of a manufacturing tolerance related gap between the support edge and the facet element is less than 10 μm.

26. The method of claim 20, wherein at least one of the following holds:

at least one further facet element is supported on a section of the support element; and a predecessor facet element mounted to the support element is removed from contact with the support edge using a definable thermal load imposed on the predecessor facet element, the definable thermal load causes thermal expansion of the predecessor facet element, the thermal expansion is sufficient to lead to disintegration of an adhesive connection between the predecessor facet element and the support element.

27. A method of making a facet mirror device, the method comprising:

providing a facet element and a support element, the facet element has a front surface optically used during operation of the facet mirror device, the facet element has a rear surface including a curved first support section, and the support element has a second support section;

placing the facet element onto the support element such that the second support section contacts the first support section to support the facet element; and reducing a pressure which acts on a part of the rear surface of the facet element relative to a pressure acting on parts of the facet element other than the part of the rear surface such that the first support section is pressed against the second support section.

28. The method of claim 27, wherein the support element includes a wall having an end, and the first support section is pressed against the end of the wall.

29. The method of claim 27, wherein the support element includes a vertex defined by an intersection between a second surface of the support element and a first surface of the wall of the support element, the vertex is defined in a sectional plane extending transverse to the second surface and the first surface of the wall, and the first support section is pressed against the vertex of the support element.

30. The method of claim 27, wherein a line contact exists between the first and second support sections when the first support section is pressed against the second support section.

31. The method of claim 27, wherein reducing a pressure which acts on the part of the rear surface of the facet element comprises pulling a vacuum on the part of the rear surface of the facet element.

32. A facet mirror device, comprising:
a facet element including a curved section; and
a support element including a support section,
wherein:
> the support section provides a support edge contacting the curved section in a contact region to support the facet element; and
> the support edge is at an end of a wall confining a recess within the support element, and the wall includes a connector section adapted to connect a suction mechanism to the recess to generate a negative pressure within the recess so that the negative pressure adjustably fixes the facet element relative to the support element during mounting of the facet element to the support element.

33. The facet mirror device of claim 32, wherein the support element includes at least one cooling duct.

34. The facet mirror device of claim 32, wherein the recess is filled with a medium selected from the group consisting of a cooling medium and a heat transfer medium.

35. A facet mirror device, comprising:
a facet element including a curved section; and
a support element including a wall having an end, the support element having a support edge at the end of the wall,
wherein:
> the support edge contacts the curved section in a contact region to support the facet element so that the facet element is tiltable relative to the support element; and
> at least one of the following holds:
>> the wall confines a recess within the support element, the wall includes a connector section adapted to connect a suction mechanism to the recess to generate a negative pressure within the recess so that the negative pressure adjustably fixes the facet element relative to the support element during mounting of the facet element to the support element;
>> the support element includes at least one cooling duct; and
>> the wall confines a recess within the support element, and the recess is filled with a cooling medium or a heat transfer medium.

36. The facet mirror device of claim 35, wherein the wall confines a recess within the support element, the wall includes a connector section adapted to connect a suction mechanism to the recess to generate a negative pressure within the recess so that the negative pressure adjustably fixes the facet element relative to the support element during mounting of the facet element to the support element.

* * * * *

UNITED STATES PATENT AND TRADEMARK OFFICE
CERTIFICATE OF CORRECTION

| | | |
|---|---|---|
| PATENT NO. | : 9,599,910 B2 | Page 1 of 1 |
| APPLICATION NO. | : 13/744943 | |
| DATED | : March 21, 2017 | |
| INVENTOR(S) | : Joachim Hartjes | |

It is certified that error appears in the above-identified patent and that said Letters Patent is hereby corrected as shown below:

In the Specification

Column 3, Line 37, delete "the a" and insert -- the --.

Column 10, Line 13, after "112.7", insert -- . --.

In the Claims

Column 12, Line 39, Claim 2, delete "element;-" and insert -- element; --.

Signed and Sealed this
Eighteenth Day of July, 2017

Joseph Matal
*Performing the Functions and Duties of the*
*Under Secretary of Commerce for Intellectual Property and*
*Director of the United States Patent and Trademark Office*